(12) United States Patent
Kim et al.

(10) Patent No.: US 8,830,562 B2
(45) Date of Patent: Sep. 9, 2014

(54) MULTI-COLOR ELECTROPHORETIC DISPLAY DEVICE, IMAGE SHEET, AND MANUFACTURING METHOD THEREOF

(75) Inventors: Chul Hwan Kim, Daejeon (KR); Yong Eui Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/639,983

(22) PCT Filed: Mar. 25, 2011

(86) PCT No.: PCT/KR2011/002091
§ 371 (c)(1),
(2), (4) Date: Jan. 8, 2013

(87) PCT Pub. No.: WO2011/126230
PCT Pub. Date: Oct. 13, 2011

(65) Prior Publication Data
US 2013/0114126 A1    May 9, 2013

(30) Foreign Application Priority Data
Apr. 6, 2010    (KR) .......................... 10-2010-0031586

(51) Int. Cl.
G02B 26/00    (2006.01)
G03F 7/20    (2006.01)
G02F 1/167    (2006.01)

(52) U.S. Cl.
CPC    *G03F 7/20* (2013.01); *G02F 1/167* (2013.01); *G02F 2201/52* (2013.01)
USPC .......................................... 359/296; 359/290

(58) Field of Classification Search
USPC .......................................... 359/290, 295–298
See application file for complete search history.

(56) References Cited

U.S. PATENT DOCUMENTS

| 2010/0033805 A1 | 2/2010 | Lee et al. |
| 2011/0199671 A1* | 8/2011 | Amundson et al. ........... 359/296 |

FOREIGN PATENT DOCUMENTS

| JP | 9-258436 A | 10/1997 |
| KR | 2004-0083923 A | 10/2004 |
| KR | 1020060124035 A | 12/2006 |
| KR | 102008029559 A | 4/2008 |
| KR | 1020080052022 A | 6/2008 |
| KR | 20090099981 A | 9/2009 |
| KR | 10-0982206 B1 | 9/2010 |

OTHER PUBLICATIONS

International Search Report mailed Nov. 22, 2011; PCT/KR2011/002091.

* cited by examiner

*Primary Examiner* — Mahidere Sahle
(74) *Attorney, Agent, or Firm* — Birch, Stewart, Kolasch & Birch, LLP

(57) ABSTRACT

A multi-color electrophoretic display (EPD) device, an image sheet, and a method of manufacturing the same. The method of manufacturing the multi-color EPD device includes: forming capsules including photosensitive color-developing capsule shells each of which stores a dielectric fluid and at least one type of electrophoretic particles dispersed in the dielectric fluid; disposing the capsules in a unit color pixel area on a substrate; exposing the capsules to light to form a latent image of a color pattern image on the capsules; and developing the photosensitive color-developing capsule shells of the capsules to form unit color pixels including color capsules.

22 Claims, 12 Drawing Sheets

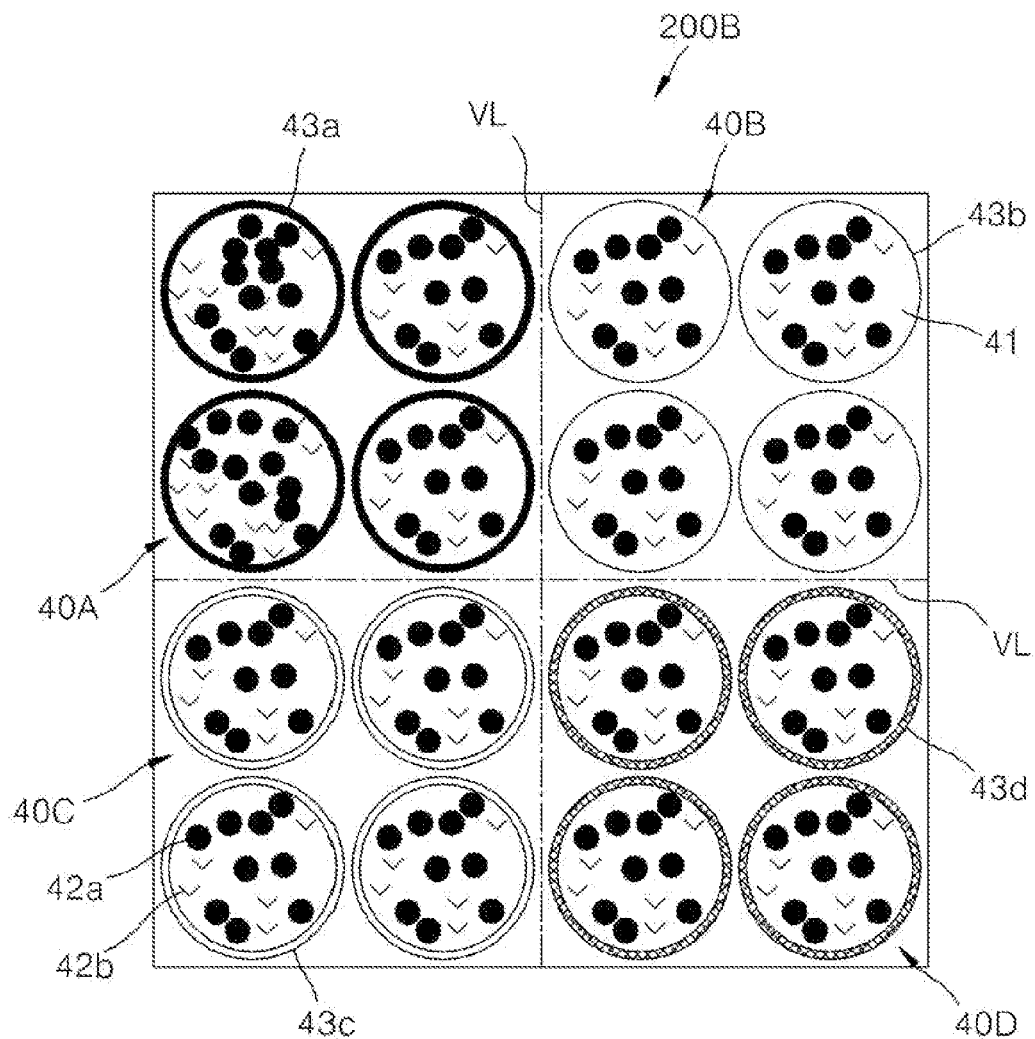

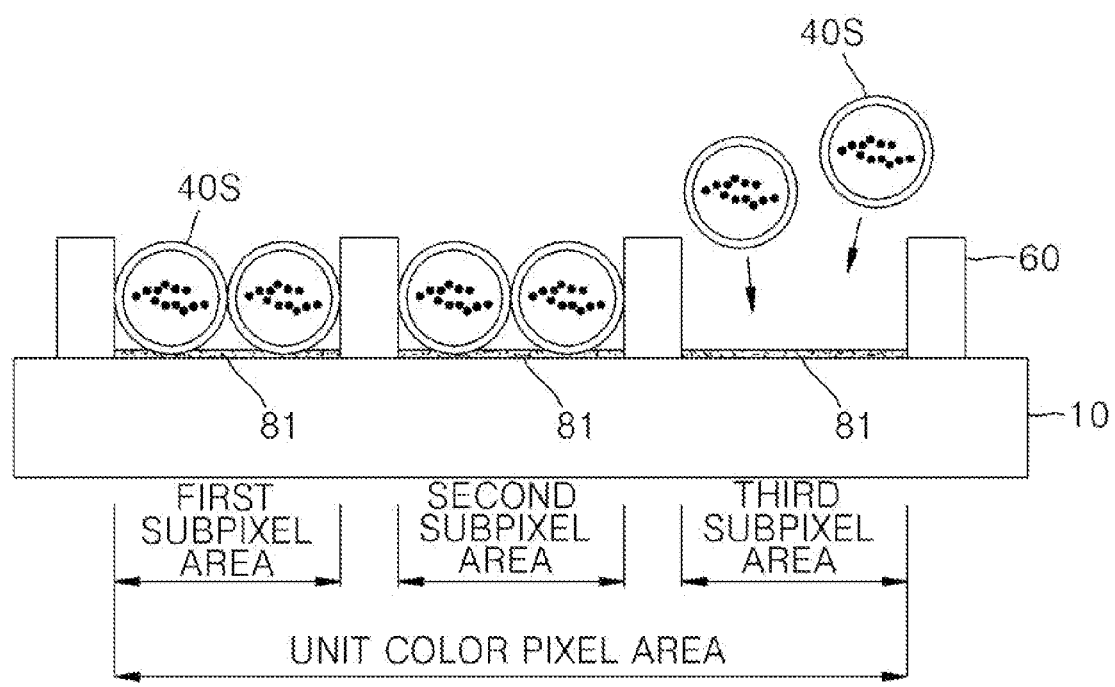

MULTI-COLOR ELECTROPHORETIC DISPLAY DEVICE, IMAGE SHEET, AND MANUFACTURING METHOD THEREOF

FIELD OF THE INVENTION

The present invention relates to a flat panel display device, and more particularly, to a multi-color electrophoretic display (EPD) device, an image sheet, and a method of fabricating the same.

BACKGROUND ART

As semiconductor fabricating technology and information communication technology have recently been developed, markets for electronic devices such as mobile phones, personal computers, visual entertainment systems, personal digital assistants (PDAs), and electronic books have expanded. Various flat panel display devices such as liquid crystal display (LCD) devices, field emission display (FED) devices, electrophoretic display (EPD) devices, and organic/inorganic electroluminescence devices are applied to such electronic devices.

Among these flat panel display devices, EPD devices are considered as next-generation display devices because they have a wide viewing angle and low power consumption, and may easily realize flexible display devices. There have been recent attempts to obtain multi-colors by applying a color filter to an EPD device. To this end, however, the color filter has to be fabricated and an additional process such as an additional process of aligning the color filter in the EPD device is required.

DISCLOSURE

Technical Problem

The present invention provides an electrophoretic display (EPD) device which may realize a multi-color display device without a color filter and may have high color saturation and high contrast.

The present invention also provides a method of fabricating the EPD device.

The present invention also provides an image sheet which may realize a multi-color display device without a color filter and may have high color saturation and high contrast.

The present invention also provides a method of fabricating the image sheet.

Technical Solution

According to an aspect of the present invention, there is provided a multi-color electrophoretic display (EPD) device including: a plurality of unit color pixels; color capsules including color capsule shells each of which stores a dielectric fluid and at least one type of electrophoretic particles dispersed in the dielectric fluid, wherein the plurality of color capsules are arranged to define subpixels of each of the unit color pixels, and the color capsule shell includes a photosensitive color-developed shell.

According to another aspect of the present invention, there is provided a method of manufacturing a multi-color electrophoretic display (EPD) device, the method including: forming capsules including photosensitive color-developing capsule shells each of which stores a dielectric fluid and at least one type of electrophoretic particles dispersed in the dielectric fluid; disposing the capsules in a unit color pixel area on a substrate; exposing the capsules to light to form a latent image of a color pattern image on the capsules; and developing the photosensitive color-developing capsule shells of the capsules to form unit color pixels including color capsules.

According to another aspect of the present invention, there is provided an image sheet including color capsules that are disposed on a support substrate, wherein the color capsules include photosensitive color-developing capsule shells each of which stores a dielectric fluid and at least one type of electrophoretic particles dispersed in the dielectric fluid.

According to another aspect of the present invention, there is provided a method of manufacturing an image sheet, the method including: forming capsules including photosensitive color-developing capsule shells each of which stores a dielectric fluid and at least one type of electrophoretic particles dispersed in the dielectric fluid; disposing the capsules on a support substrate; exposing the capsules to light to form a latent image of a predetermined color pattern image on the capsules; and developing the photosensitive color-developing capsule shells of the capsules to form unit color pixels including color capsules.

Advantageous Effects

Since a multi-color display device according to embodiments of the present invention switches light by using an electrophoretic layer including a plurality of color capsules, the multi-color display device may be realized without a color filter. Thus, the multi-color display device may have high color saturation and high contrast.

Also, an image sheet according to embodiments of the present invention may implement multi-colors without light loss due to a color filter.

BRIEF DESCRIPTION OF THE DRAWINGS

FIGS. 3A and 3B are views illustrating unit color pixels in which three types of color capsules include capsule shells having different colors, according to embodiments of the present invention;

FIGS. 5A through 5E are cross-sectional views for explaining processes of the method of FIG. 4.

BEST MODE

Figure 1:
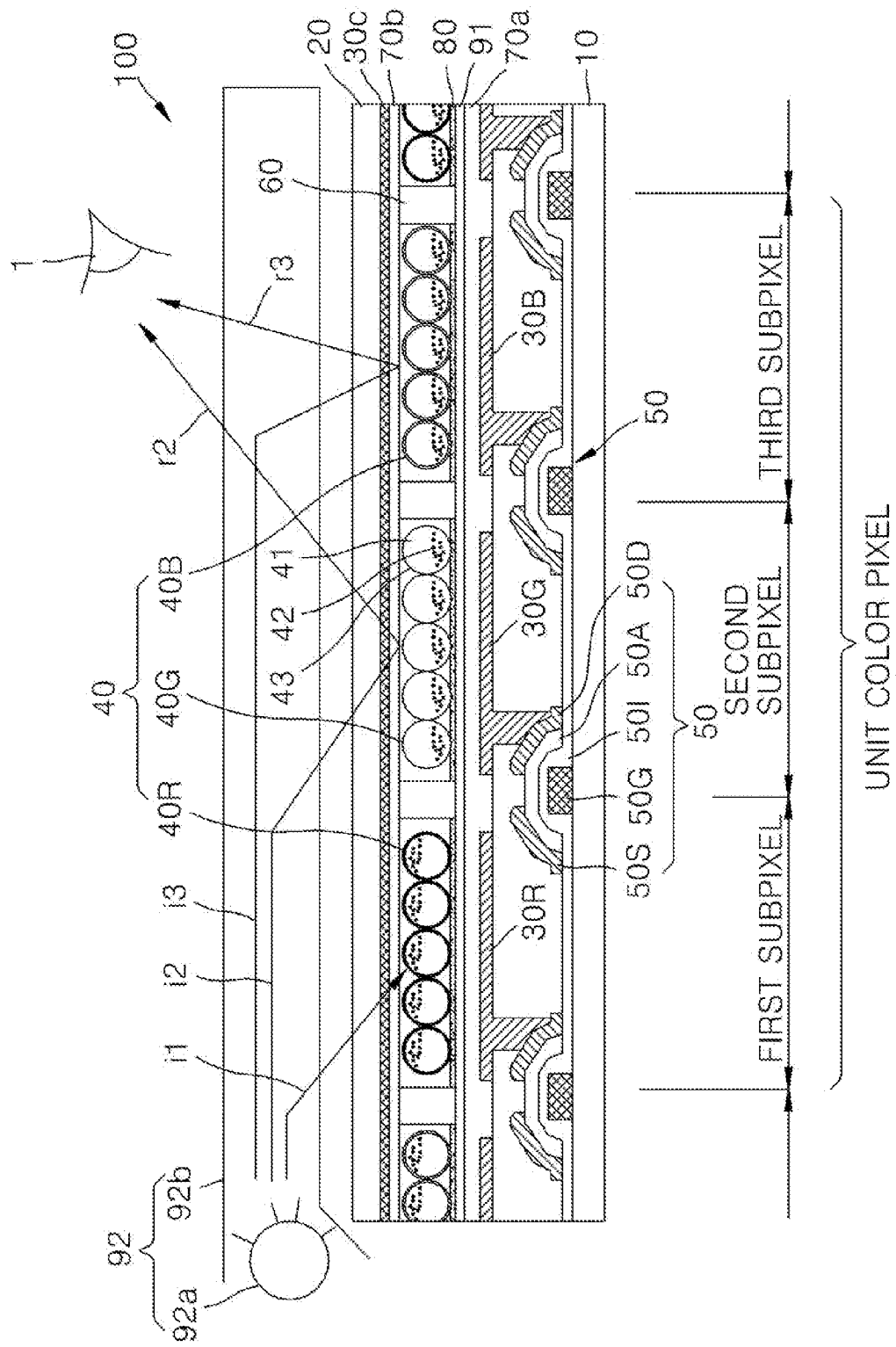
FIG. 1 is a cross-sectional view illustrating an electrophoretic display (EPD) device which is a multi-color EPD device, according to an embodiment of the present invention.

Hereinafter, exemplary embodiments will be described in greater detail with reference to the accompanying drawings.

Embodiments may take many different forms and should not be construed as being limited to those set forth herein. Rather, these embodiments are provided so that this disclosure will be thorough and complete, and will fully convey the concept of the invention to those skilled in the art.

In the drawings, lengths and sizes of layers and regions may be exaggerated for clarity. Like reference numerals in the drawings denote like elements. The term "and/or" used herein includes any one of listed items or a combination of two or more thereof.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or the group thereof, but do not preclude the presence or addition of one or more other features, integers, steps, operations, elements, components, and/or groups thereof.

It is also understood that when a layer is referred to as being "on" another layer or substrate, it can be directly on the other or substrate or intervening layers or layers formed in the intervening layers may also be present. It will be clearly understood by those skilled in the art that a structure or shape "adjacent to" another shape may have a portion overlapping the other shape or a portion below the other shape.

Spatially relative terms, such as "below", "above", "upper", "lower" "horizontal", or "vertical", may be used herein for ease of description to describe one element, layer, or region's relationship to another element(s), layer(s), or region(s) as illustrated in the figures. It will be understood that the spatially relative terms are intended to encompass different orientations of the device in use or operation in addition to the orientation depicted in the figures.

Exemplary embodiments are described herein with reference to drawings that are schematic illustrations of exemplary embodiments (and intermediate structures). As such, variations from the shapes of the illustrations as a result, for example, of fabricating techniques and/or tolerances, may be expected. Thus, exemplary embodiments should not be construed as limited to the particular shapes of regions illustrated herein but may be to include deviations in shapes that result, for example, from fabricating.

Structure and Operation of Multi-Color EPD Device

FIG. 1 is a cross-sectional view illustrating an electrophoretic display (EPD) device 100 which is a multi-color EPD device, according to an embodiment of the present invention.

Referring to FIG. 1, the EPD device 100 includes a first substrate (which may be a lower substrate 10) and a second substrate (which may be an upper substrate 20) that faces the lower substrate 10. At least one of the lower substrate 10 and the upper substrate 20, for example, the upper substrate 20, may be transparent, and the remaining substrate, that is, the lower substrate 10, may not be transparent. Alternatively, both the lower substrate 10 and the upper substrate 20 may be transparent.

Each of the lower substrate 10 and the upper substrate 20 may be a glass substrate, or may be formed of an inorganic material having a single crystalline structure or a polycrystalline structure. Each of the lower substrate 10 and the upper substrate 20 may be flexible. In this case, each of the lower substrate 10 and the upper substrate 20 may be formed of a resin-based material. For example, the resin-based material may be, but is not limited to, any one of a cellulose-based resin; a polyester resin such as polyethylene terephthalate (PET) or polyethylene naphthalate (PEN); a polyethylene resin; a polyvinyl chloride resin; polycarbonate (PC); polyether sulfone (PES); polyether etherketone (PEEK); and polyphenylene sulfide (PPS), or a combination thereof.

Electrodes facing to each other may be respectively formed on the lower substrate 10 and the upper substrate 20 to generate an electric field perpendicular to main surfaces of the lower substrate 10 and the upper substrate 20. For example, as shown in FIG. 1, when a unit color pixel of the EPD device 100 includes first through third subpixels, one or a plurality of pixel electrodes 30R, 30G, and 30B may be formed on the lower substrate 10 respectively for the first through third subpixels. Also, a common electrode 30c facing the pixel electrodes 30R, 30G, and 30B may be disposed on the upper substrate 10. Each of the first, second, and third subpixels may be a subpixel of any one color of red, green, blue, magenta, cyan, and yellow for the purpose of providing color display.

Although three subpixels constitute one unit color pixel in FIG. 1, the present embodiment is not limited thereto. For example, a unit color pixel may include two subpixels, or four or more subpixels including additional subpixels for displaying black and/or white in order to improve color rendition as will be described below.

Each of the pixel electrodes 30R, 30G, and 30B may have a pattern suitable for a passive or active matrix addressing scheme. FIG. 1 exemplarily illustrates an electrode structure that may be driven by using an active matrix addressing scheme, and the pixel electrodes 30R, 30G, and 30B may be driven by using an appropriate switching element 50, for example, a metal-oxide semiconductor (MOS) thin film transistor. The switch element 50 may include a semiconductor layer 50A having a channel region and source/drain regions, a gate electrode 50G, and a gate insulating film 501 disposed between the semiconductor layer 50A and the gate electrode 50G.

The switch element 50 and each of the pixel electrodes 30R, 30G, and 30B may be electrically connected to each other through a drain electrode 50D, and a source electrode 50S may be electrically connected to a data line (not shown). When the gate electrode 50G and the source electrode 50S are arranged in an array of a plurality of rows and a plurality of columns, an active matrix suitable for obtaining multi-colors is realized. Alternatively, as is well known in the art, a simple electrode structure for a static drive method using segments may be within the scope of the present invention. If necessary, a driving member may be formed on the upper substrate 20, and the common electrode 30c may be controlled as an individual electrode by being connected to the driving member.

At least one of the electrodes 30R, 30G, 30B, and 30c may be a transparent electrode. For example, in FIG. 1, the common electrode 30c of the upper electrode 20 that provides a visual surface to an observer 1 is a transparent electrode. Also, in order to implement a transmissive display device, the pixel electrodes 30R, 30G, and 30B may also be transparent electrodes. Each of the transparent electrodes may be formed of, but is not limited to, any one of a transparent metal oxide such as indium-tin-oxide (ITO), fluorinated tin oxide (FTO), indium oxide (IO), or tin oxide ($SnO_2$), a transparent conductive resin such as polyacetylene, and a conductive resin including fine conductive metal particles, or a combination thereof. Electrically insulating protective films 70a and 70b for protecting the electrodes 30R, 30G, 30B, and 30c may be formed on the electrodes 30R, 30G, 30B, and 30c.

A plurality of color capsules 40R, 40G, and 40B which may be collectively denoted by 40 and constitute the first through third subpixels are disposed between the lower substrate 10 and the upper substrate 20. The color capsules 40R, 40G, 40B may be arranged as a single layer. Although the color capsules 40 have spherical shapes in FIG. 1, the color capsules 40 may each have a fan-like cross-sectional shape which has a surface whose projection area increases closer to the upper substrate 20 and decreases closer to the lower substrate 10. Alternatively, the color capsules 40 may each have a rectangular parallelepiped cross-sectional shape.

Each of the plurality of color capsules 40 stores therein a dielectric fluid 41 and electrophoretic particles 42 having at least one color and dispersed in the dielectric fluid 41. The dielectric fluid 41 and the electrophoretic particles 42 are encapsulated in a capsule shell 43. The capsule shell 43 may be formed by, but is not limited thereto, an encapsulation reaction such as a chemical process such as emulsion polymerization, interfacial polymerization, or in-situ polymerization, a physical process such as co-extrusion or phase separation, or a simple/complex coacervation.

Materials of the capsule shell 43 formed by using the simple coacervation may include, but are not limited to, a cellulose-based derivative such as gelatin, polyvinyl alcohol, polyvinyl acetate, or carboxymethyl cellulose. Materials of the capsule shell 43 formed by using the complex coacervation may include, but are not limited to, gelatin, acacia, caragenan, carboxymethyl cellulose, hydrolyzed styrene anhydride copolymer, agar, casein, albumin, and cellulose phthalate. Materials of the capsule shell 43 formed by using the phase separation may include, but are not limited to, polystyrene, polymethyl methacrylate (PMMA), polyethyl methacrylate, polybutyle methacrylate, ethyl cellulose, and polyvinyl pyridine. Materials of the capsule shell 43 formed by using the insitu polymerization may include, but are not limited to, polyhydroxyamide, melamine, urea, soluble oligomers, and vinyl monomers such as styrene and methyl methacrylate (MMA). Also, materials of the capsule shell 43 formed by using the interfacial polymerization may include, but are not limited to, sebacoyl, adipoyl, diamine, polyamine, alcohol, and isocyanate.

Materials of the capsule shell 43 formed by using the emulsion polymerization may include, but are not limited to, styrene, vinyl acetate, acrylic acid, butyl acrylate, t-butyl acrylate, methyl methacrylate, and methacrylate. Alternatively, the capsule shell 43 may be formed of water-soluble polymers, water-dispersed polymers, oil-soluble polymers, a thermosetting resin, a thermoplastic resin, or an ultraviolet (UV) or radiation curable resin.

After forming a transparent capsule shell, a color of the color capsule shell 43 may be provided by developing the corresponding color of the transparent capsule shell 43. A process of developing a color of the color capsule shell 43 will be explained below.

The capsule shells 43 of the plurality of color capsules 40 may have colors corresponding to the first, second, and third subpixels. For example, in order to obtain multi-colors by using a red/green/blue (RGB) color system, the first through third subpixels may be a red pixel, a green pixel, and a blue pixel, respectively. In this case, the capsule shells 43 of the color capsules 40R of the first subpixel are red. Likewise, the capsule shells 43 of the color capsules 40G of the second subpixel and the color capsules 40B of the third subpixel may be green and blue, respectively.

Alternatively, the EPD device 100 may obtain multi-colors by using a cyan/magenta/yellow (CMY) color system. In this case, the capsule shells 43 of the color capsules 40 of the first through third subpixels may be cyan, magenta, and yellow, respectively.

The dielectric fluid 41 encapsulated in the capsule shell 43 is a fluid having high resistance. The dielectric fluid 41 may be a single fluid or a mixture of two or more fluids. The dielectric fluid 41 may be prepared such that a specific gravity of the dielectric fluid 41 is substantially equal to a specific gravity of the electrophoretic particles 42 dispersed in the dielectric fluid 41.

The dielectric fluid 41 may be a non-aqueous solution or a non-polar liquid. For example, the dielectric fluid 41 may be a hydrocarbon-containing solution such as decahydronaphthalene (DECALIN), 5-ethylidene-2-norbornene, fatty acid ester, or paraffin oil, an aromatic hydrocarbon-containing solution such as toluene, xylene, phenylxylyethane, dodecylbenzene, or alkylnaphthalene, or a halogenated solution such as perfluorodecalin, perfluorotoluene, perfluoroxylene, dichlorobenzotrifluoride, 3,4,5-trichlorobenzotrifluoride, chloropentafluro-benzene, dichlorononane, pentachlorobenzene, or tetrachloroethylene. In addition to the electrophoretic particles 42, any of various functional additives such as a charge-controlling agent, a cationic or anionic ion surfactant, a metallic soap, a resin material, a metal-based binder, and a stabilizing agent may be added to the dielectric fluid 41.

The electrophoretic particles 42 dispersed in the dielectric fluid 41 may be positively or negatively charged, and may be formed of solid pigments, dyed particles, or a combination of at least one of the solid pigments and the dyed particles and polymers. For example, the combination of the pigments and the polymers may be obtained by, but is not limited to, coating the pigments on polymer particles or mixing the pigments and the polymers in an appropriate ratio.

The electrophoretic particles 42 may be light-absorbing electrophoretic particles as shown in FIG. 1. For example, the light-absorbing electrophoretic particles may be black electrophoretic particles such as aniline black, carbon black, or titanium black particles.

Alternatively, the EPD device 100 may have a rib structure 60 that defines subpixels. In this case, the color capsules 40R, 40G, and 40B having different colors may be separated from one another by the rib structure 60. Alternatively, the rib structure 60 may be omitted.

Unlike in FIG. 1, the rib structure 60 may be further formed to define a unit color pixel. When the capsules 40 are disposed as a single layer, a height of the rib structure 60 may be substantially equal to a diameter of each of the capsules 40. A color of the rib structure 60 may be, but is not limited to, white, or black to function as a black matrix.

The color capsules 40R, 40G, and 40B of the first through third subpixels may be bonded to the lower substrate 20 by using an adhesive member 80 such as an adhesive layer or a binder. Alternatively, the color capsules 40R, 40G, and 40B may be respectively bonded to the first through third subpixels through self-assembly by coating a predetermined receptor compound on each of the first through third subpixels and forming a functional group which may specifically bind to the receptor compound on a surface of the capsule shell 43, which will be explained below with reference to FIG. 5B.

The EPD device 100 may further include a reflective film 91 that is disposed between the color capsules 40 and the lower substrate 10. Accordingly, when the EPD device 100 is a reflective display device, the display quality of the EPD device 100 may be improved. Also, in such a case, the EPD device 100 may further include a front illumination member 92 that includes a light source 92a such as a light-emitting diode (LED) and a light guide plate 92b.

A method of driving the EPD device 100 of FIG. 1 will now be explained. For convenience of explanation, it is assumed that the electrophoretic particles 42 are black electrophoretic particles which are positively charged, the first through third subpixels constituting the unit color pixel are respectively red, green, and blue subpixels, and the EPD device 100 is a reflective display device.

When a scan signal is received through the gate electrode 50G and a data signal is received through the source electrode 50S, a predetermined electric field may be formed between the pixel electrodes 30R, 30G, and 30B and the common electrode 30c. For example, a positive potential may be applied to the pixel electrode 30R of the first subpixel, a negative potential may be applied to the pixel electrodes 30G and 30B of the second and third subpixels, and a ground potential may be applied to the common electrode 30c. In this case, an electric field directed from the lower substrate 10 toward the upper substrate 20 is formed in the first subpixel, and an electric field from the upper substrate 20 toward the lower substrate 10 is formed in the second and third subpixels. FIG. 1 illustrates a distribution of the black electrophoretic particles 42 due to the electric fields.

In the red subpixel (that is, in the first subpixel), light i1 incident through the light guide plate 92b is absorbed by the black electrophoretic particles 42. As a result, light reflected by the red subpixel is turned off. However, light i2 and light i3 incident through the light guide plate 92b are respectively reflected as reflected light r2 and reflected light r3 by the green subpixel (that is, the second subpixel) and the blue subpixel (the third subpixel), and the reflected light r2 and the reflected light r3 are turned on. In this case, an observer 1 may observe a color obtained by mixing the reflected light r2 which is green light and the reflected light r3 which is blue light. Although only the first subpixel which is the red subpixel is turned off in FIG. 1, it will be understood by one of ordinary skill in the art that 8-bit multi-colors may be obtained by turning on/off the first through third subpixels, and when a plurality of pixel electrodes are provided in one subpixel, gradation may be achieved.

Figure 2A:
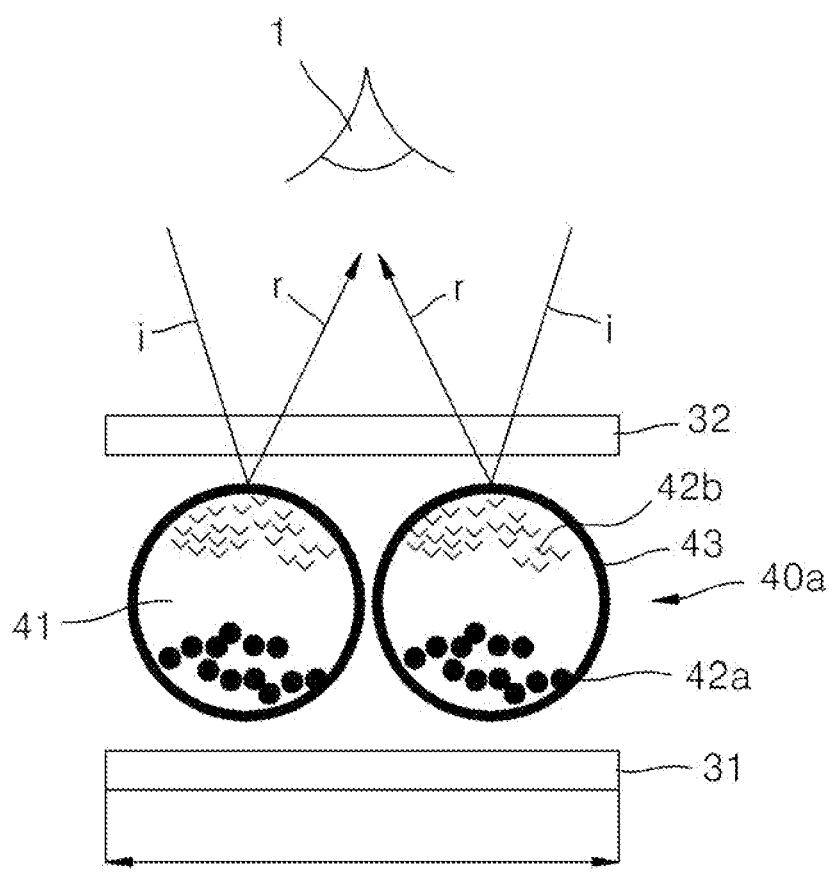
FIGS. 2A and 2B are cross-sectional views illustrating subpixels applicable to the EPD device of FIG. 1, according to embodiments of the present invention.
Figure 2B:
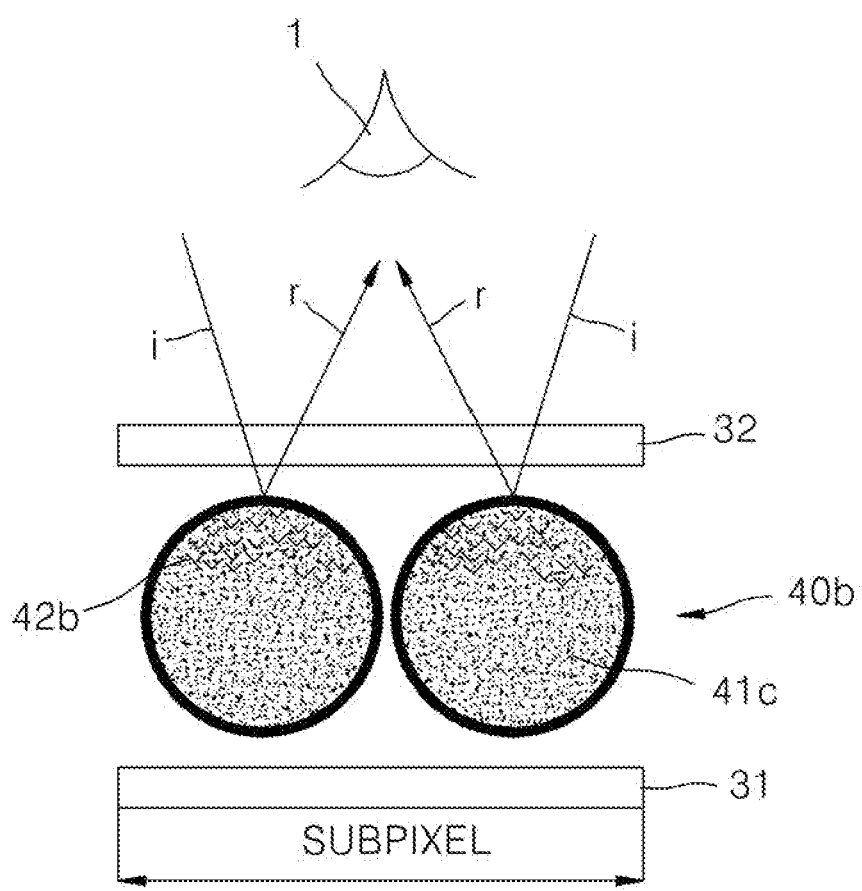

FIGS. 2A and 2B are cross-sectional views illustrating subpixels applicable to the EPD device 100 of FIG. 1, according to embodiments of the present invention.

Referring to FIG. 2A, a subpixel includes a pixel electrode 31 and a common electrode 32 which face each other. Color capsules 40a disposed between the pixel electrode 31 and the common electrode 32 may include the capsule shells 43 having predetermined colors such as red, blue, and green, or cyan, magenta, and yellow, instead of an achromatic color as described in FIG. 1. However, in FIG. 2A, reflective electrophoretic particles 42b as well as light-absorbing electrophoretic particles 42a are further included in the dielectric fluid 41 of each of the color capsules 40a.

The reflective electrophoretic particles 42b may be white particles and may include, for example, titanium dioxide, antimony trioxide, zinc sulfide, zinc oxide, or calcium carbonate ($CaCO_3$).

In an embodiment, the reflective electrophoretic particles 42b may be electrically neutral. Alternatively, the reflective electrophoretic particles 42b may have polarities opposite to polarities of the light-absorbing electrophoretic particles 42b. In such an embodiment, under the same electric field, the reflective electrophoretic particles 42b show opposite mobilities to those of the light-absorbing electrophoretic particles 42b. Alternatively, the particles 42a, 42b may have same polarity. However, the particles 42a, 42b may have different electrophoretic mobility according to the amount of charges of the particles 42a, 42b.

FIG. 2A illustrate a distribution of the light-absorbing electrophoretic particles 42a and the reflective electrophoretic particles 42b when the light-absorbing electrophoretic particles 42a have positive polarity and the reflective electrophoretic particles 42b have negative polarities and an electric field directed from the common electrode 32 toward the pixel electrode 31 is formed.

In the subpixel of FIG. 2A, incident light i is reflected as reflected light r by the reflective electrophoretic particles 42b in the color capsules 40a and the reflected light r is turned on, and the observer 1 may observe light of a wavelength range corresponding to colors of the color shells 43. When polarities of the pixel electrode 31 and the common electrode 32 are reversed, the reflected light r may be turned off. In FIG. 2A, since not only the light-absorbing electrophoretic particles 42a and the reflective electrophoretic particles 42b help light to be turned on/off, the contrast of displayed information may be improved.

Referring to FIG. 2B, color capsules 40b may include a light-absorbing dielectric fluid 41c in which black dyes and/or pigments are dispersed, instead of the light-absorbing electrophoretic particles 42a. A subpixel of FIG. 2B may further include the reflective electrophoretic particles 42b to switch the reflected light r.

FIG. 2B illustrates a distribution of the reflective electrophoretic particles 42b when the reflective electrophoretic particles 42b have negative polarity and an electric field directed from the common electrode 32 toward the pixel electrode 31 is formed. Like in FIG. 2A, contrast may be improved due to the light-absorbing dielectric fluid 41c and the reflective electrophoretic particles 42b.

Figure 3A:
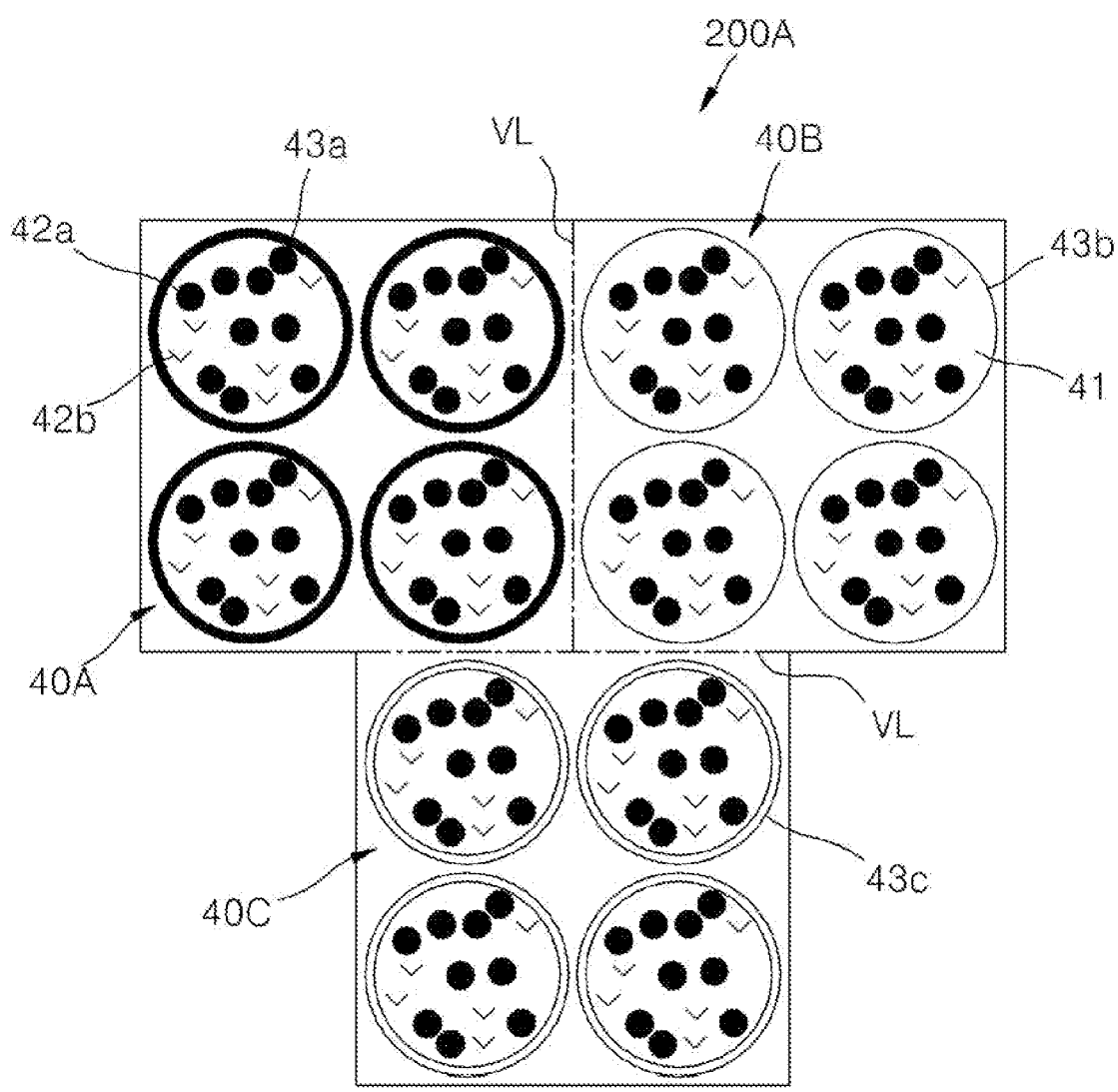

FIGS. 3A and 3B are top views illustrating unit color pixels 200A and 200B according to embodiments of the present invention.

A unit color pixel may include two or more subpixels in which a plurality of color capsules are arranged in a two-dimensional (2D) manner. FIGS. 3A and 3B illustrate that three types of color capsules 40A, 40B, and 40C including capsule shells 43a, 43b, and 43c of different colors are arranged in a 2D manner.

The subpixels are defined in each of the unit color pixels 200A and 200B divided by a virtual line VL that is indicated by a dash-dotted line. The subpixels may have the same size or different sizes in consideration of display quality such as color saturation and contrast. Also, the subpixels may be separated by the rib structure 60 that is disposed at a position of the virtual line VL as described above with reference to FIG. 1.

Although the subpixels have rectangular parallelepiped shapes in FIGS. 3A and 3B, the present embodiment is not limited thereto. For example, the subpixels may have spherical shapes, oval shapes, or arbitrary polygonal shapes such as triangular shapes or pentagonal shapes. Alternatively, the subpixels may have stripe or meander shapes continuously formed over an adjacent unit color pixel. Likewise, the unit color pixels 200A and 200B may have spherical shapes, oval shapes, polygonal shapes such as triangular shapes or pentagonal shapes, stripe shapes, or meander shapes in which the subpixels are arranged in a 2D manner, The color capsules 40A, 40B, and 40C arranged in each subpixel may be red color capsules, green color capsules, and blue color capsules. Alternatively, the plurality of color capsules 40A, 40B, and 40C may be, for example, cyan color capsules, magenta color capsules, and yellow color capsules.

At least one type of electrophoretic particles for switching light, that is, at least one type of particles of the light-absorbing electrophoretic particles 42a and the reflective electrophoretic particles 42b, are dispersed in the dielectric fluid 41 of each of the color capsules 40A, 40B, and 40C as described above. Also, as described above with reference to FIG. 2B, each of the color capsules 40A, 40B, and 40/c may include reflective electrophoretic particles and a dielectric fluid in which any one or all of light-absorbing pigments and dyes are dispersed instead of a transparent dielectric fluid.

Referring to FIG. 3B, the unit color pixel 200B may further include a subpixel including transparent capsules 40D including a transparent shell 43d, as well as subpixels including the plurality of color capsules 40A, 40B, and 40C. Particles in the transparent shell 43d may include reflective electrophoretic particles or light-absorbing electrophoretic particles, or both as described above. Due to a light-switching operation of the transparent capsules 40D, an independent subpixel showing an achromatic color may be provided, and thus achromatic color rendition of the unit color pixel 200B may be further improved.

Alternatively, particles in the transparent shell 43d may be chromatic electrophoretic particles, instead of achromatic electrophoretic particles. The subpixel including the chromatic electrophoretic particles may complement or replace the subpixels including the color capsules 10A, 40B, and 40C.

Method of Manufacturing Multi-Color EPD Device

Figure 4:
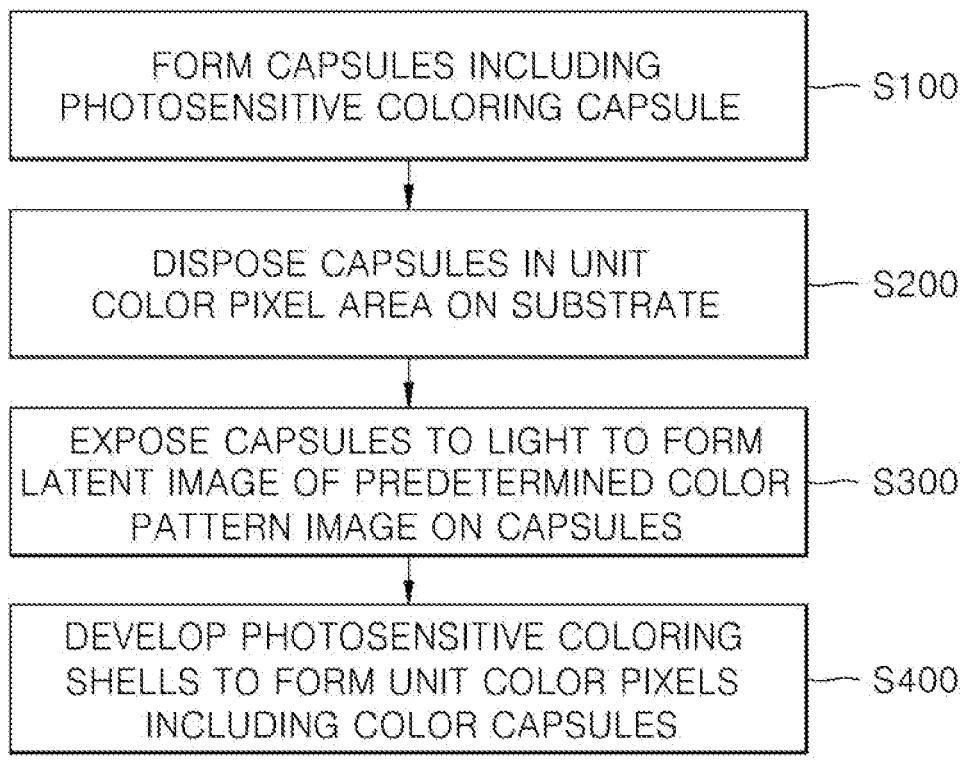
FIG. 4 is a flowchart illustrating a method of manufacturing an EPD device which is a multi-color EPD device, according to an embodiment of the present invention.

FIG. 4 is a flowchart illustrating a method of manufacturing an EPD device which is a multi-color EPD device, according to an embodiment of the present invention. FIGS. 5A through 5E are cross-sectional views for explaining processes of the method of FIG. 4.

Figure 5A:
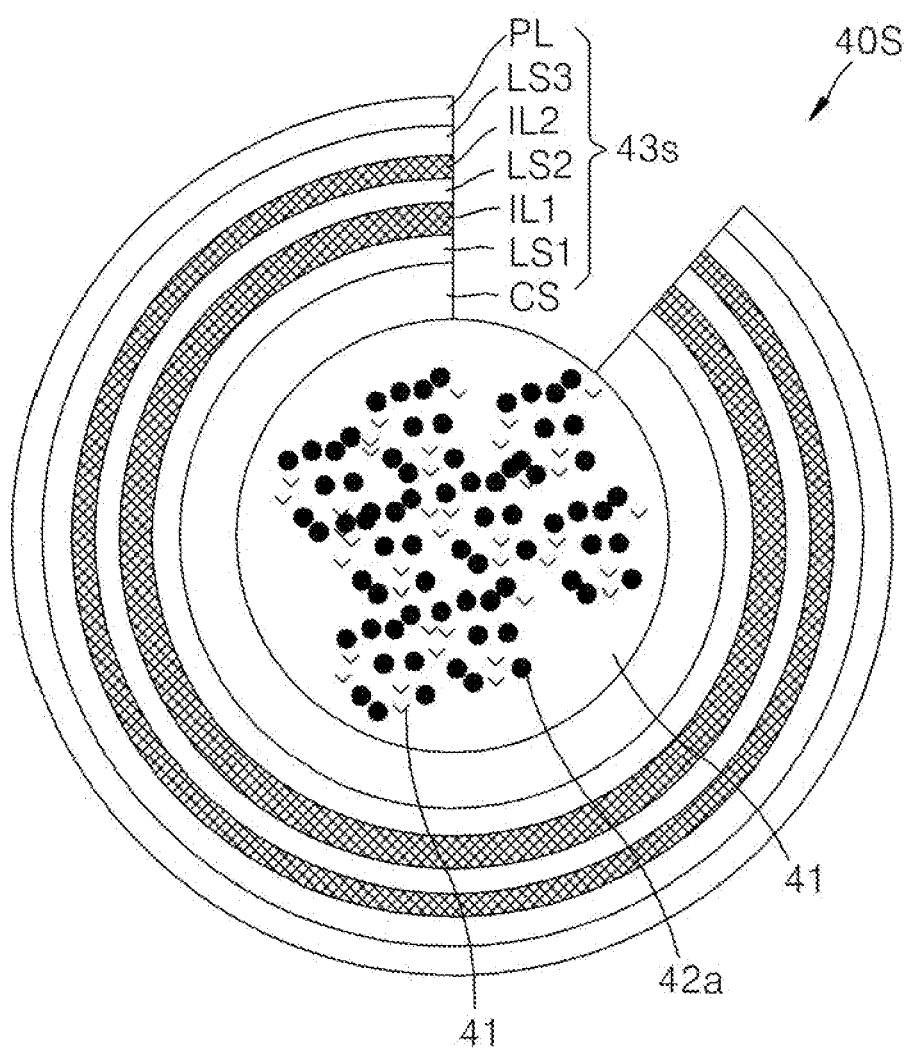

Referring to FIGS. 4 and 5A, in operation S100, capsules 40S including photosensitive color-developing capsule shells 43s are formed. FIG. 5A is a cross-sectional view illustrating some of layers in order to clearly display the layers. Each of the capsules 40S may be a transparent capsule before a color is produced through exposure and development. Each of the photosensitive color-developing capsule shells 43s may be formed by forming a transparent capsule shell CS and stacking one layer or two or more different photosensitive color developing layers LS1, LS2, and LS3 on an outer surface of the transparent capsule shell CS.

In order to form the capsule 40S, a first phase inner fluid including a dielectric fluid in which at least one type of electrophoretic particles are dispersed is prepared. Also, a second phase encapsulated fluid is prepared. The second phase is different from the first phase. Next, a predetermined encapsulation reaction is induced between the encapsulated fluid and the inner fluid, to form the capsule 40S including the transparent capsule shell CS in which a part of the first phase fluid and some of the at least one type of electrophoretic particles are encapsulated.

In the capsule shell CS of the capsule 40S formed by using the encapsulation process, the dielectric fluid 41 and at least one type of electrophoretic particles, that is, the light-absorbing electrophoretic particles 42a and the reflective electrophoretic particles 42b dispersed in the dielectric fluid 41 are stored. Next, the photosensitive color developing layers LS1, LS2, and LS3 are sequentially stacked on the outer surface of the capsule shell CS of the capsule 40S, thereby completely manufacturing the capsule 40 including the photosensitive color-developing capsule shell 43s. The photosensitive color developing layers LS1, LS2, and LS3 stacked on the transparent capsule shell CS are layers formed of a material whose color is produced by using exposure and development as will be described below.

The photosensitive color developing layers LS1, LS2, and LS3 may be respectively a red light sensitive color developing layer, a green light sensitive color developing layer, and a blue light sensitive color developing layer having sensitivity to light in red, green, and blue wavelength bands which are primary color wavelength bands. An order of stacking the photosensitive color developing layers LS1, LS2, and LS3 layers is arbitrarily determined, and two, or four or more different photosensitive color developing layers may be stacked according to a color display system required by the EPD device.

The photosensitive color developing layers LS1, LS2, and LS3 which are photosensitive metal salt emulsion layers including a coupler of a predetermined color may include, but is not limited to, a dye forming coupler of a predetermined color, halogenated silver grains, and a binder of coupling them. For example, the photosensitive color developing layers LS1, LS2, and LS3 may include non-silver salt materials such as chromic salts, ferric salts, and diazo compound such as O-quinone diazide. Also, instead of halogenated silver, an appropriate salt compound such as an organic borate compound including boron and an alkali metal cation such as Cu, Pd, Fe, Co, Sn, Mo, Cr, Ni, As, or Se. The binder may be formed of a film forming material such as gelatin, alginic acid, or latex polymer. Alternatively, another appropriate polymer material may be used for the binder.

When the photosensitive color developing layers LS1, LS2, and LS3 are respectively a red light sensitive color developing layer, a green light sensitive color developing layer, and a blue light sensitive color developing layer, a cyan (C) dye coupler, a magenta (M) dye coupler, and a yellow (Y) dye coupler which react with photosensitive halogenated silver and are in a complementary relationship with photosensitive colors may be respectively included in the photosensitive color developing layers LS1, LS2, and LS3.

The C dye coupler may be, for example, phenol, naphtol, or a derivative thereof. The M dye coupler may be, for example, pyrazolone, cyanoacetyl, or a derivative thereof. Also, the Y dye coupler may be, for example, acylacetamide or a derivative thereof. The couplers are exemplary, and other appropriate couplers may be used considering dye yield.

Although the photosensitive color developing layers LS1, LS2, and LS3 are formed on the transparent capsule shell CS in FIG. 5A, a photosensitive color-developing capsule shell instead of a transparent capsule shell may be formed. To this end, in the encapsulation process, a photosensitive material such as halogenated silver grains and a predetermined dye coupler may be added to the first phase inner fluid or the second phase encapsulated fluid. In this case, due to subsequent exposure and development processes, a capsule shell may produce a predetermined color. The photosensitive color-developing capsule shell may replace any one or all of the photosensitive color developing layers LS1, LS2, and LS3. For example, when the capsule shell CS is a red light color developing layer, only a green light color developing layer and a blue light color developing layer may be stacked on the capsule shell.

The photosensitive color-developing capsule shell 43s including the photosensitive color developing layers LS1, LS2, and LS3 stacked on the transparent capsule shell CS may further include anti-crosstalk interlayers IL1, IL2, and IL3. For example, when the plurality of photosensitive color developing layers LS1, LS2, and LS3 are stacked on the capsule shell CS, in a development process which will be explained below, in order to prevent chemical crosstalk where a developing agent oxidized from one photosensitive color developing layer moves to and react with a dye coupler of another photosensitive color developing layer, additional layers such as the anti-crosstalk interlayers IL1 and IL2 may be further stacked between the photosensitive color developing layers LS1, LS2, and LS3.

The anti-crosstalk interlayers IL1 and IL2 may be, for example, non-light sensitive interlayers. A well-known reducing agent such as a scavenger for reducing the oxidized developing agent into a reducing agent may be included in each of the anti-crosstalk interlayers IL1 and IL2. The reducing agent of each non-light sensitive interlayer may be an organic reducing agent including hydroquinone or a derivative thereof. Optionally, the anti-crosstalk interlayers IL1, IL2, and IL3 may be well-known low speed photosensitive layers including an appropriate dye coupler and halogenated silver grains including, for example, 90% or more silver chloride, instead of a scavenger or along with a small amount of scavenger.

A protective layer PL may be further formed on an uppermost layer of the capsule shell 43S. The protective layer PL may be formed of an appropriate material that may absorb or reflect ultraviolet light incident from a light source during an exposure process which will be explained below, thereby improving photosensitive properties of the photosensitive color developing layers LS1, LS2, and LS3. Alternatively, the protective layer PL may protect the capsule 40S from mechanical stress and abrasion which may occur during a process of manufacturing the EPD device, or may prevent penetration of moisture due to hydrophobic surface properties. According to required optical, mechanical, or chemical surface properties, the protective layer PL may be formed of any of various materials, and the present embodiment is not limited thereto.

Referring back to FIGS. 4 and 5, in operation S200, the plurality of capsules 40S which are manufactured and do not produce colors yet are disposed in a unit color pixel area on the substrate 10. The substrate 10 may be, for example, the lower substrate 10 (see FIG. 1) on which a pixel electrode is formed. The lower substrate may include different types of first through third subpixel areas. The rib structure 60 that defines subpixel areas and a unit color pixel area may be formed on the substrate 10. The rib structure 60 may be a pattern whose mechanical strength is high such as a silicon oxide formed by using photolithography and etching, or a patterned photoresist formed by using photolithography.

Before the capsules 40S are disposed on the substrate 10, an adhesive layer 81 may be coated as a bonding member in each subpixel area of the substrate 10 to which the capsules 40S are to be bonded. The adhesive layer 81 may be formed of, but is not limited to, any one of acrylate copolymer, ethylenevinylacetate copolymer, polycarbonate, and styrene copolymer, or a combination thereof.

Next, the capsules 40S are disposed on the substrate 10. The capsules 40S may fill in an inner space of the rib structure 60 by using a coating unit such as a doctor blade. In order to increase mobilities of the capsules 40S, an ultrasonic oscillation may be applied to the substrate 10 and/or the capsules 40S. Next, the adhesive layer 81 and the capsules 40S are bonded to each other. A process of bonding the adhesive layer 81 and the capsules 40S may be performed by using chemical energy such as crosslinking using UV radiation, or thermal or mechanical pressure.

Alternatively, in order to bond the capsules 40S to the substrate 10, a binder 82 (see FIG. 5C) may be used as an adhesive member. For example, the capsules 40S are dispersed in a fluid in which the binder 82 is included, and the fluid including both the capsules 40S and the binder 82 is coated in each subpixel area by using a predetermined coating process using ultrasound waves and/or a doctor blade. Next, predetermined thermal, mechanical, or chemical energy is applied to the binder 82 coated on the substrate 10 to cure the binder 82, thereby bonding the capsules 40 and the substrate 10. The binder 82 may include, for example, an ultraviolet curable monomer mixture, a photo-initiator, or a light amplifier.

Figure 5C:
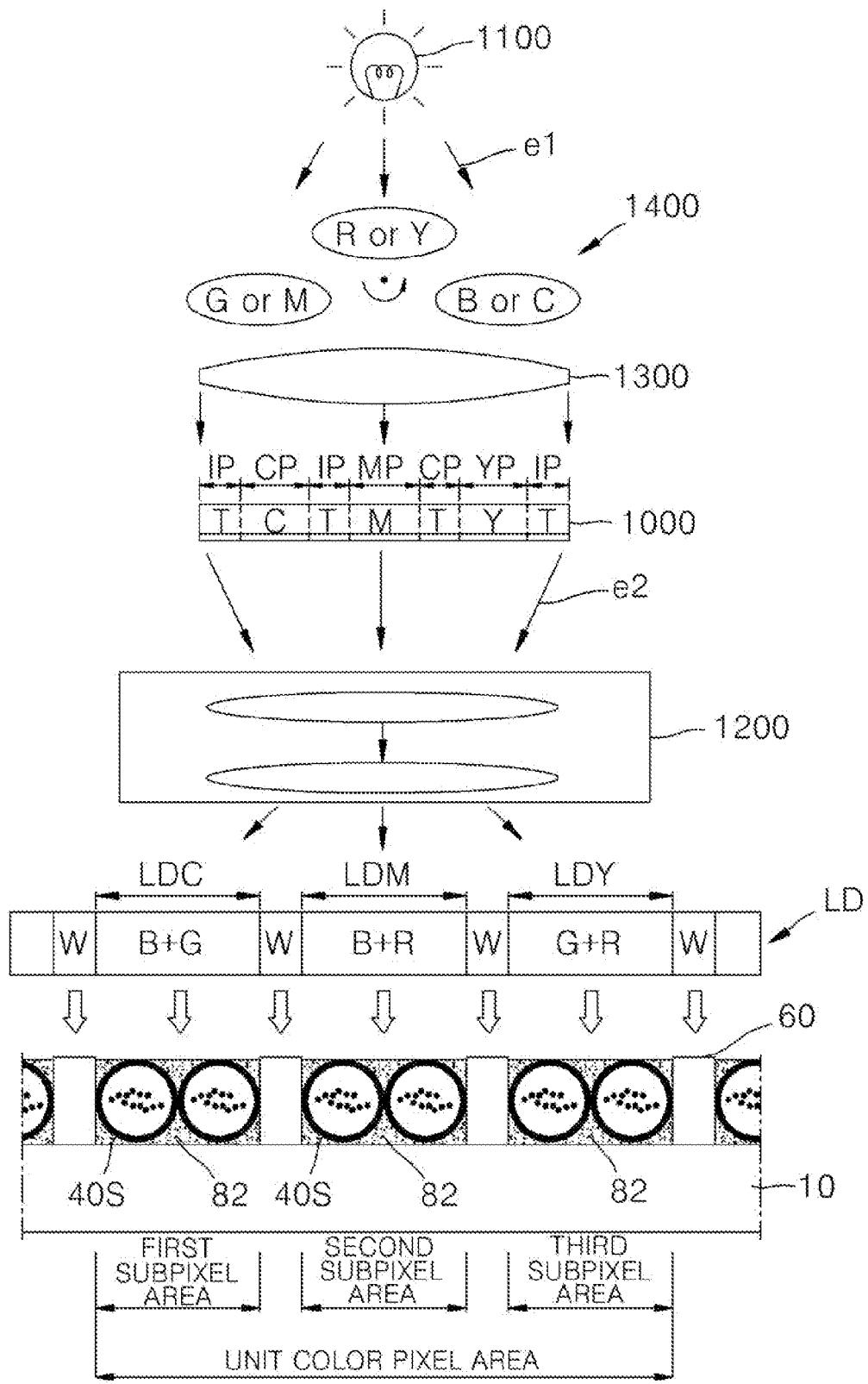
Figure 5D:
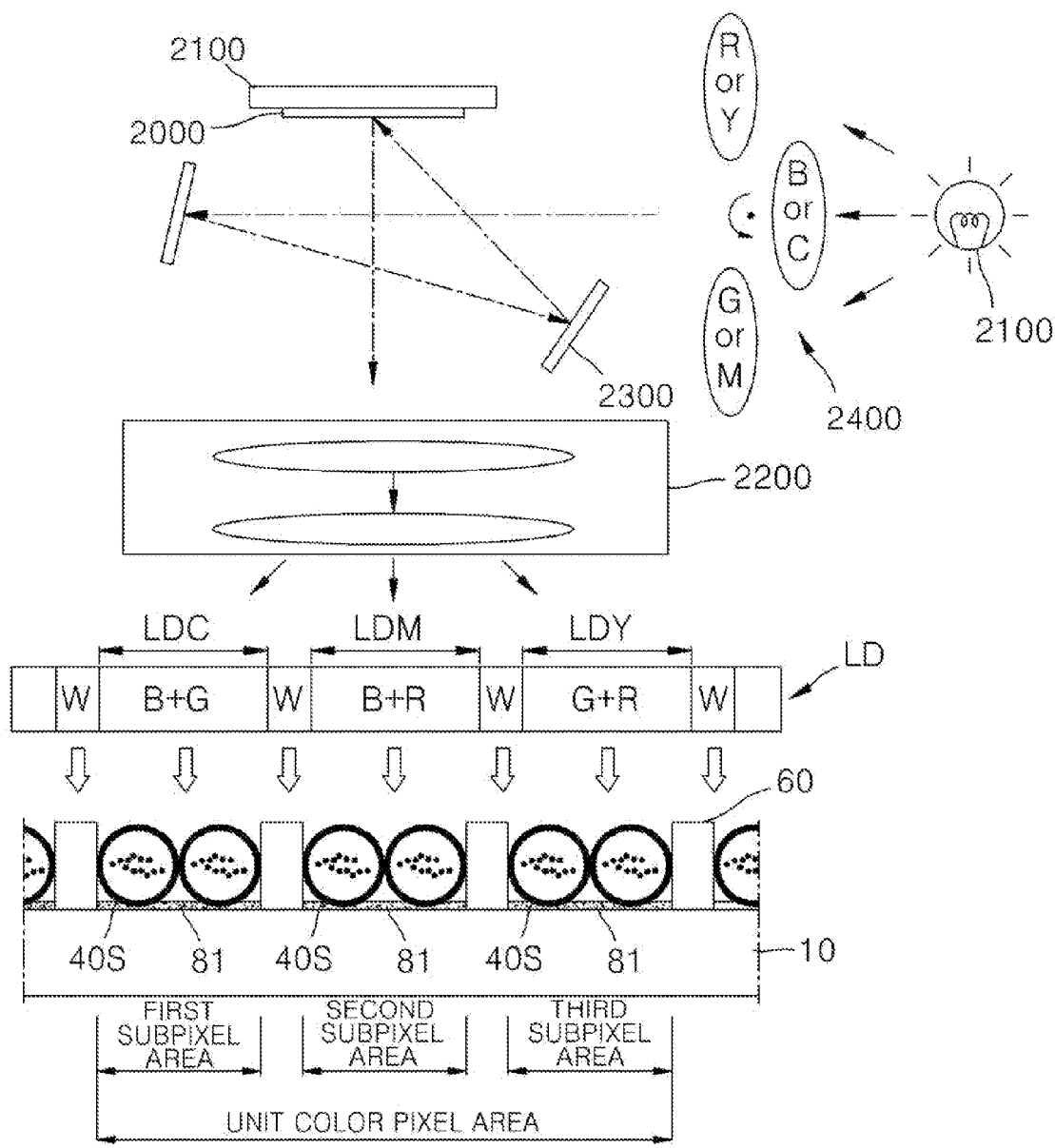

Next, as shown in FIG. 4, in operation S300, the capsules 40S are exposed to light to form a latent image of unit color pixels on the capsules 40S. FIGS. 5C and 5D are cross-sectional views for explaining an exposure process for forming a latent image, according to an embodiment of the present invention.

The exposure process may be performed by using a printing method using a color filter 1000 of FIG. 5C, or a digital printing method using an image frame 2000 obtained from pixel pattern image information stored as electronic information of FIG. 5D. In FIGS. 5C and 5D, Y, M, and C respectively denote yellow, magenta, and cyan, and R, G, B, K, and W respectively denote red, green, blue, black, and white. Also, T denotes whether to be transparent.

Referring to FIG. 5C, the color filter 1000 includes a predetermined color pattern image to be transferred to the photosensitive color developing layers LS1, LS2, and LS3 (see FIG. 5A) of the capsule 40S. The color filter 1000 may be a positive film or a negative film. The color filter 1000 may include a cyan (C) pattern unit CP, a magenta (M) pattern unit MP, and a yellow (Y) pattern unit YP respectively corresponding to subpixels of a unit color pixel so as to perform color printing by using a subtractive color mixing method. Also, the color filter 1000 may further include a pattern separation area IP that separates the C pattern unit CP, the M pattern unit MP, and the Y pattern unit YP at predetermined intervals. The pattern separation area IP may be a transparent area through which white light may transmit.

When light e1 is emitted by a light source 1100 to a side of the color filter 1000 opposite to a surface of the color filter 1000 facing the capsules 40S, light e2 passing through the color filter 1000 is separated to have a light distribution spectrum LD, and the color pattern image is projected to the capsules 40S. The projected color pattern image becomes a latent image of unit color pixels.

In detail, when the light e1 incident on the color filter 1000 is white light, a red wavelength band of the light e1 is blocked by the C pattern unit CP of the color filter 1000, and light LDC of red and blue wavelength bands passes through the C pattern unit CP and is emitted to the capsules 40S of a corresponding first subpixel area. Likewise, a green wavelength band and a blue wavelength band of the white light e1 are respectively blocked by the M pattern unit MP and the Y pattern unit YP of the color filter 1000, and thus light LDM of blue and red wavelength bands is emitted to the capsules 40S of a second subpixel area and light LDY of green and red wavelength bands is emitted to the capsules 40S of a third subpixel area. When the color filter 1000 has the pattern separation area IP and the pattern separation area IP is transparent and allows white light to transmit therethrough, the rib structure 60 corresponding to the pattern separation area IP may be exposed to white light.

An exposure device used in the exposure process S300 may include the light source unit 1100 that includes a tungsten or halogen lamp and emits the light e1 for exposure, a filter fixing unit that supports the color filter 1000, and a lens system 1200 that is disposed between the color filter 1000 and the capsule shells 40S to be exposed and may increase or decrease a size of the color pattern image of the color filter 10009 to be transmitted. Also, the exposure device may include a condenser 1300 that is disposed in an optical path between the light source unit 1100 and the color filter 1000, concentrates the light e1 emitted from the light source unit 1100, and uniformly emits the light e1 to the color filter 1000. Also, the exposure device may further include additive or subtractive color filters 1400 such as R, G, and B filters and Y, M, and C filters for modulating a color.

Alternatively, in the exposure process S300, exposure may be performed by using a digital printing method using the color pattern image as shown in FIG. 5D. Referring to FIG.

5D, a digital exposure device may include a light source unit 2100, a display element 2100 that forms an image on the image frame 2000 having an image equal to or similar to the color pattern image of the color filter 1000 of FIG. 5C, and at least one mirror 2300 that changes an optical path to transfer the image frame 2000 displayed on the display device 2200 to the capsules 40S.

The digital exposure device may further include a lens system 2200 that is disposed between the image frame 2000 and the capsules 40S. Also, the digital exposure device may further include additive or subtractive color filters 2400 for modulating a color to be exposed. Alternatively, a digital exposure device such as a micro mirror type light projector may be used. The digital exposure device may include a spatial light modulator including an array of micro mirrors and a micro mirror that may be inclined in order to reflect a light spot. It is obvious that a method of manufacturing the color filter 1000 is not limited to the digital exposure device, and an appropriate digital printing method that may exposure the capsules 40S by using pixel pattern image information which is electronically stored is within the scope of the present invention.

Figure 5E:
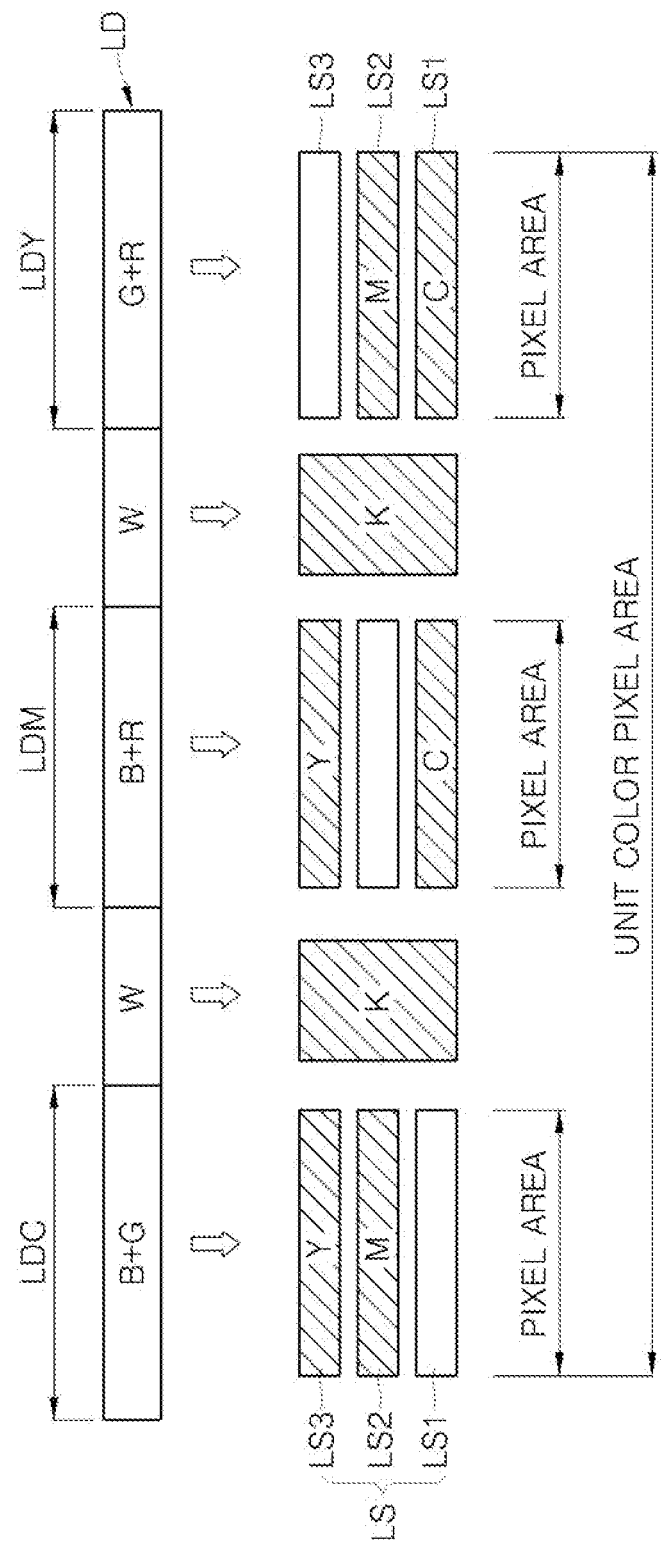

FIG. 5E is a cross-sectional view for explaining a coloring mechanism of the capsules 40S using the exposure process S300 described with reference to FIGS. 5C and 5D. In FIG. 5E, all of the capsules 40S disposed in first through third subpixel areas are not shown, and only photosensitive color developing layers LS1, LS2, LS3, and LS4 related to the coloring mechanism are schematically shown. It is assumed that the photosensitive color developing layers LS include a red light sensitive color developing layer LS1, a green light sensitive color developing layer LS2, and a blue light sensitive color developing layer LS3 which are sequentially disposed from a surface of the capsule shell CS.

When the light e2 passing through the color filter 1000 is separated to have the light distribution spectrum LD and is projected to the capsules 40S, only the green light sensitive color developing layer LS2 and the blue light sensitive color developing layer LS3 from among the photosensitive color developing layers LS1, LS2, and LS3 stacked on the capsule shell CS are exposed to light for capsules of the first subpixel area. Likewise, for capsules of the second subpixel area, only the red light sensitive color developing layer LS1 and the blue light sensitive color developing layer LS3 are exposed to light. Also, for capsules of the third subpixel area, only the red light sensitive color developing layer LS1 and the blue light sensitive color developing layer LS2 are exposed to light. When the rib structure 60 is formed of a photosensitive material, the photosensitive material may be exposed to white light. In this manner, a latent image of a color pattern image may be formed by using the rib structure 60 and each photosensitive color developing layer.

Referring back to FIG. 4, in operation S400, the capsules 40S on which a latent image of the color pattern image is formed are developed, and a color of the photosensitive color-developing capsule shell 43s is produced, thereby forming unit color pixels including the color pixels 40 (see FIG. 1). The development process 400 may be appropriately optionally performed according to a material of a photosensitive color developing layer which is used.

As described above, when halogenated silver chloride is used for a photosensitive color developing layer of the capsule shell 43s, a development process which is well known in photography may be used. For example, the development process S400 may be performed by using a developing solution including any one of metol, quinol, quinon, phenidon, and a derivative thereof, or a combination thereof. The halogenated silver chloride of the photosensitive color developing layer reacts with the developing solution to be reduced into silver, thereby forming an oxidized color developer (Dox). Next, the Dox may react with a dye forming coupler included in the photosensitive color developing layer to produce dyes, thereby producing a color of the photosensitive color developing layer.

The developing solution may be provided by being contained in a bath that may adjust a temperature of the developing solution. The substrate 10 on which the exposed capsules 40 are disposed are dipped in the developing solution for a predetermined period of time. In this case, the developing solution may be stirred, and a development accelerator such as peroxide or boron may be added.

As shown in FIG. 5E, when a C dye forming coupler, an M dye forming coupler, and a Y dye forming coupler are respectively present in the red, green, and blue light color developing layers LS1, LS2, and LS3, color developing layers whose colors are produced (indicated by slashed lines) respectively form red, green, and blue pixels by using a subtractive color mixing method in subpixel areas. Also, when the rib structure 60 is formed of a photosensitive material, a color of the rib structure 60 which is black is produced to form a black matrix in the development process S400.

After the development process S400, a bleaching process using a well-known bleacher may be further performed to remove an unnecessary photosensitive color element, such as a black halogenated silver chloride included in the photosensitive color developing layer. Also, a fixing process of removing halogenated silver grains which are not exposed during the exposure process may be further performed. A fixing solution may include sodium thiosulfate, ammonium thiosulfate, or a mixture thereof. Optionally, a rinsing process may be further performed between the bleaching process and the fixing process.

Although a negative method in which a color of an exposed area of a photosensitive color developing layer is produced is described in the above, it will be understood by one of ordinary skill in the art that a positive method in which a color of an unexposed area is produced is also within the scope of the present invention. In this case, red, green, and blue color developing layers may be used as color developing layers.

Next, as shown in FIG. 1, the upper substrate 20 on which the common electrode 30c is formed is fixedly attached to the lower substrate 10 on which the color capsules 40 are formed, thereby completing the EPD device 100. According to the embodiments of the present invention, a conventional color filter may be replaced by color capsules. In a conventional EPD device using a color filter, since an optical path between the color filter and electrophoretic particles is long, light loss occurs because light is guided by members disposed between the color filter and the electrophoretic particles, thereby reducing visibility. According to the present invention, however, since capsule shells function as electrophoretic particles and a color filter, an optical path is minimized, thereby improving display quality.

Image Sheet and Method of Fabricating the Same

Figure 6:
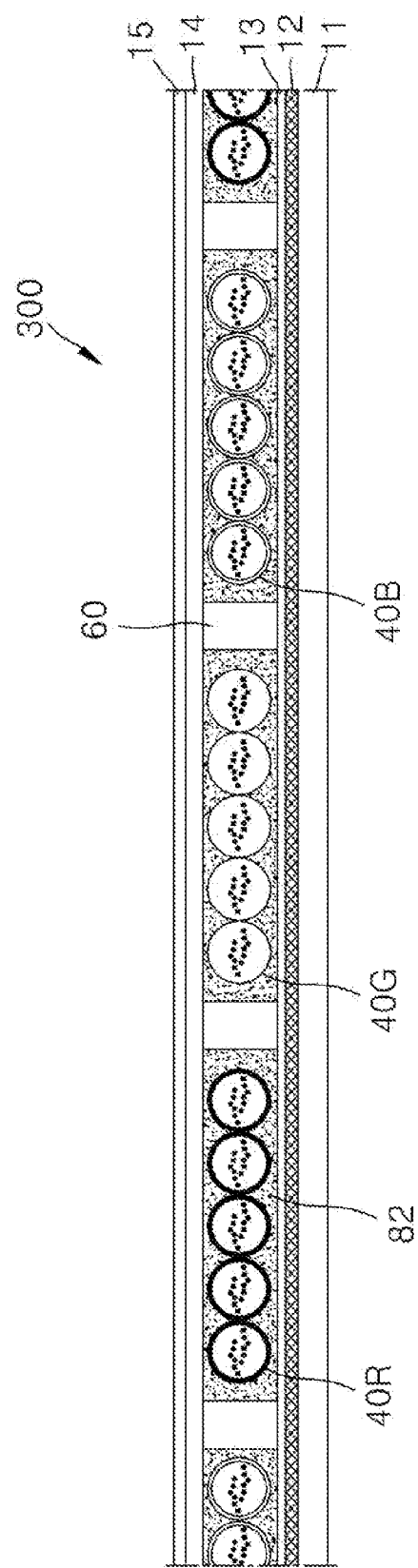
FIG. 6 is a cross-sectional view illustrating an image sheet according to an embodiment of the present invention.

FIG. 6 is a cross-sectional view illustrating an image sheet 300 according to an embodiment of the present invention. Although color capsules are disposed on a lower substrate on which pixel electrodes are formed in FIGS. 5a through 5e, the color capsules may be disposed on an upper substrate to obtain a resultant structure, and the resultant structure may be overturned and may be coupled to the lower substrate on which the pixel electrodes for driving the color capsules are formed, thereby obtaining an EPD device.

The image sheet 300 of FIG. 6 refers to a layer including color capsules which are light converting members used by being coupled to a lower substrate on which a driving element is formed. The image sheet 300 includes a support substrate 11, and two or more types of color capsules 40R, 40G, and 40B arranged on the support substrate 11. An arrangement of the plurality of color capsules 40R, 40G, and 40B and a process of producing a color have been described with reference to FIGS. 5B through 5E. The color capsules 40R, 40G, and 40B may be bonded to the support substrate 11 by using the binder 80. Alternatively, the color capsules 40R, 40G, and 40B may be bonded to the support substrate 11 by using the adhesive layer 81 (see FIG. 1). The color capsules 40R, 40G, and 40B may be separated from one another by the rib structure 60 formed on the support substrate 11.

The support substrate 11 may be a surface exposed to an observer, like the upper substrate 10 of the EPD device of FIG. 1. In this case, the support substrate 11 may be formed of a transparent material as described above. Also, a transparent conductive layer 12 may be formed between the support substrate 11 and the color capsules 40R, 40G, and 40B. The transparent conductive layer 12 may be used as a common electrode 30c (see FIG. 1) of the EPD device. In this case, a protective layer 13 for protecting the transparent conductive layer 12 may be further formed on the transparent conductive layer 12 as described above with reference to FIG. 1.

An adhesive complex layer including an adhesive layer 14 and a release layer 15 disposed on the adhesive layer 14 may be further formed on the color capsules 40R, 40G, and 40B. In order to stack the image sheet 300 on a lower substrate on which pixel electrodes are formed, the release layer 15 may be removed, and the lower substrate and the image sheet 300 may be coupled to each other by using the adhesive layer 14 that is exposed. An intermediate layer having a predetermined wiring structure having a via-hole and a wiring pattern connected through the via-hole may be further disposed between the image sheet 300 and the lower substrate.

In FIGS. 5 and 6, it will be understood that an adhesive layer and a binder may be compatibly used or a combination of the adhesive layer and the binder may be used. Also, the term 'coating' does not limit the scope of the present invention, and coating may be used to have the same meaning as printing. For example, a coating process includes any type of printing and coating processes such as patch dye coating; slot or extrusion coating; slide or cascade coating; curtain coating; roll coating; gravure coating; dip coating; spray coating; meniscus coating; spin coating; brush coating; air knife coating; silk screen printing; electrostatic printing; and thermal printing.

Also, although color capsules are used as a member that may replace a color filter in the embodiments, it is obvious that a color filter may be used along with the color capsules in order to improve color rendition.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

Since a multi-color display device according to embodiments of the present invention switches light by using an electrophoretic layer including a plurality of color capsules, the multi-color display device may be realized without a color filter. Thus, the multi-color display device may have high color saturation and high contrast.

Also, an image sheet according to embodiments of the present invention may implement multi-colors without light loss due to a color filter.

What is claimed is:

1. A method of manufacturing a multi-color electrophoretic display (EPD) device, the method comprising:
    forming capsules comprising photosensitive color-developing capsule shells each of which stores a dielectric fluid and at least one type of electrophoretic particles dispersed in the dielectric fluid;
    disposing the capsules in a unit color pixel area on a substrate;
    exposing the capsules to light to form a latent image of a color pattern image on the capsules; and
    developing the photosensitive color-developing capsule shells of the capsules to form unit color pixels comprising color capsules,
    wherein the each photosensitive color-developing capsule shell comprises a first photosensitive color developing layer, a second photosensitive color developing layer, and a third photosensitive color developing layer, and
    wherein at least one of the first photosensitive color developing layer, the second photosensitive color developing layer, and the third photosensitive color developing layer is color-developed.

2. The method of claim 1, wherein the capsules are disposed as a single layer.

3. The method of claim 1, wherein the forming of the capsules comprising the photosensitive color-developing capsule shells comprises:
    preparing a first phase inner fluid comprising the dielectric fluid in which the at least one type of electrophoretic particles are dispersed;
    preparing a second phase encapsulated fluid, wherein the second phase is different from the first phase;
    inducing an encapsulation reaction between the encapsulated fluid and the inner fluid, to form capsules comprising capsule shells in which a part of the first phase fluid and some of the at least one type of electrophoretic particles are encapsulated; and
    stacking one or more photosensitive color developing layers on outer surfaces of a transparent capsule shell of the capsules.

4. The method of claim 3, wherein the capsule shells are the photosensitive color-developing capsule shells.

5. The method of claim 3, wherein the one or more photosensitive color developing layers comprises a photosensitive metal salt emulsion layer comprising a coupler of a predetermined color.

6. The method of claim 5, wherein the photosensitive metal salt emulsion layer comprises a dye forming coupler of a predetermined color, halogenated silver grains, and a binder.

7. The method of claim 3, wherein each of the photosensitive color developing layers is any one of a cyan color developing layer, a magenta color developing layer, and a yellow color developing layer, and subpixels of the unit color pixel are defined when the two or more color developing layers overlap each other.

8. The method of claim 1, wherein before the disposing of the capsules, the method further comprises forming a rib structure that is disposed on the substrate and separates at least one of the unit color pixels and subpixels included in the unit pixels.

9. The method of claim 8, wherein the rib structure is formed of a photosensitive coloring material, and the rib structure acts as a black matrix during the developing of the photosensitive color-developing capsule shells.

10. The method of claim 1, wherein the exposing of the capsules comprises:
providing a color filter comprising the color pattern image to the capsules; and
emitting light on a side of the color filter opposite to a surface of the color filter facing the capsules to project the color pattern image to the capsules.

11. The method of claim 1, wherein the exposing of the capsules comprises:
providing an image frame from electronic information about the color pattern image; and
projecting the image frame to the capsules.

12. The method of claim 1, wherein the developing of the photosensitive color-developing capsule shells comprises developing the photosensitive color-developing capsule shells of the capsules by using a developing solution comprising any one of metol, quinol, quinon, a phenidon, and a derivative thereof, or a combination thereof.

13. The method of claim 1, wherein after the developing of the photosensitive color-developing capsule shells, the method further comprises performing a bleaching process of removing an unnecessary photosensitive element included in the photosensitive color-developing capsule shells.

14. The method of claim 1, wherein after the developing of the photosensitive color-developing capsule shells, the method further comprises performing a fixing process of removing a non-photosensitive element included in the photosensitive color developing layers.

15. The method of claim 12, wherein the capsules are bonded to the substrate by using an adhesive layer or a binder.

16. The method of claim 1, wherein the substrate is a lower substrate on which a pixel electrode of the multi-color EPD device is formed.

17. A multi-color electrophoretic display (EPD) device comprising:
a plurality of unit color pixels;
a plurality of color capsules comprising color capsule shells each of which stores a dielectric fluid and at least one type of electrophoretic particles dispersed in the dielectric fluid,
wherein the plurality of color capsules are arranged to define subpixels of each of the unit color pixels, wherein the each photosensitive color-developing capsule shell comprises a first photosensitive color developing layer, a second photosensitive color developing layer, and a third photosensitive color developing layer, and
wherein at least one of the first photosensitive color developing layer, the second photosensitive color developing layer, and the third photosensitive color developing layer is color-developed.

18. A method of manufacturing an image sheet, the method comprising:
forming capsules comprising photosensitive color-developing capsule shells each of which stores a dielectric fluid and at least one type of electrophoretic particles dispersed in the dielectric fluid;
disposing the capsules on a support substrate;
exposing the capsules to light to form a latent image of a predetermined color pattern image on the capsules; and
developing the photosensitive color-developing capsule shells of the capsules to form unit color pixels comprising color capsules,
wherein the each photosensitive color-developing capsule shell comprises a first photosensitive color developing layer, a second photosensitive color developing layer, and a third photosensitive color developing layer,
wherein at least one of the first photosensitive color developing layer, the second photosensitive color developing layer, and the third photosensitive color developing layer is color-developed.

19. The method of claim 18, wherein the support substrate is a transmissive substrate.

20. The method of claim 18, wherein the support substrate further comprises a transparent conductive layer disposed between the capsules and the support substrate.

21. The method of claim 18, wherein after the developing of the photosensitive color-developing capsule shells, the method further comprises stacking an adhesive complex layer that comprises an adhesive layer and a release layer disposed on the adhesive layer on the color capsules.

22. An image sheet comprising color capsules that are disposed on a support substrate,
wherein the color capsules comprise photosensitive color-developing capsule shells each of which stores a dielectric fluid and at least one type of electrophoretic particles dispersed in the dielectric fluid,
wherein the each photosensitive color-developing capsule shell comprises a first photosensitive color developing layer, a second photosensitive color developing layer, and a third photosensitive color developing layer, and
wherein at least one of the first photosensitive color developing layer, the second photosensitive color developing layer, and the third photosensitive color developing layer is color-developed.

* * * * *